(12) United States Patent
Chen et al.

(10) Patent No.: US 10,466,557 B2
(45) Date of Patent: Nov. 5, 2019

(54) ARRAY SUBSTRATE, MANUFACTURING METHOD THEREOF, AND DISPLAY DEVICE

(71) Applicants: BOE Technology Group Co., Ltd., Beijing (CN); Hefei BOE Optoelectronics Technology Co., Ltd., Hefei (CN)

(72) Inventors: Chuanbao Chen, Beijing (CN); Juncai Ma, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 37 days.

(21) Appl. No.: 15/519,370

(22) PCT Filed: Feb. 5, 2016

(86) PCT No.: PCT/CN2016/073627
§ 371 (c)(1),
(2) Date: Apr. 14, 2017

(87) PCT Pub. No.: WO2017/049842
PCT Pub. Date: Mar. 30, 2017

(65) Prior Publication Data
US 2017/0227803 A1  Aug. 10, 2017

(30) Foreign Application Priority Data

Sep. 24, 2015  (CN) .......................... 2015 1 0618081

(51) Int. Cl.
*G02F 1/1368* (2006.01)
*G02F 1/1343* (2006.01)
(Continued)

(52) U.S. Cl.
CPC ........ *G02F 1/1368* (2013.01); *G02F 1/13439* (2013.01); *G02F 1/134309* (2013.01);
(Continued)

(58) Field of Classification Search
CPC ............. G02F 1/1368; G02F 1/136286; G02F 1/134309; G02F 1/13439
See application file for complete search history.

(56) References Cited

U.S. PATENT DOCUMENTS

2002/0180901 A1  12/2002  Kim
2003/0107037 A1   6/2003  Youn et al.
(Continued)

FOREIGN PATENT DOCUMENTS

CN  103353695 A  10/2013
CN  104090402 A  10/2014
(Continued)

OTHER PUBLICATIONS

Jun. 17, 2016—(WO) International Search Report and Written Opinion Appn PCT/CN2016/073627 with English Tran.
(Continued)

*Primary Examiner* — Thomas L Dickey
(74) *Attorney, Agent, or Firm* — Banner & Witcoff, Ltd.

(57) ABSTRACT

An array substrate, manufacturing method thereof, and display device. The array substrate comprises a subpixel unit, and the subpixel unit comprises: a first transparent common electrode a pixel electrode disposed over and insulated from the first transparent common electrode, wherein an orthographic projection of the first transparent common electrode on a surface where the pixel electrode is located has an overlapping portion with the pixel electrode; and a second transparent common electrode disposed over and insulated from the pixel electrode.

20 Claims, 5 Drawing Sheets

(51) Int. Cl.
*G02F 1/1362* (2006.01)
*H01L 27/12* (2006.01)
*H01L 29/786* (2006.01)

(52) U.S. Cl.
CPC ...... *G02F 1/136286* (2013.01); *H01L 27/124* (2013.01); *H01L 27/1248* (2013.01); *H01L 27/1259* (2013.01); *G02F 2001/134318* (2013.01); *G02F 2001/134345* (2013.01); *G02F 2001/134381* (2013.01); *G02F 2201/121* (2013.01); *G02F 2201/123* (2013.01); *G02F 2201/40* (2013.01); *H01L 27/1222* (2013.01); *H01L 27/1225* (2013.01); *H01L 29/7869* (2013.01); *H01L 29/78678* (2013.01)

(56) References Cited

U.S. PATENT DOCUMENTS

| | | | |
|---|---|---|---|
| 2007/0126969 A1* | 6/2007 | Kimura | G02F 1/134363 349/141 |
| 2010/0208187 A1* | 8/2010 | Saito | G02F 1/134363 349/143 |
| 2011/0104841 A1 | 5/2011 | Shieh et al. | |
| 2012/0019759 A1* | 1/2012 | Sunohara | G02F 1/134309 349/138 |
| 2012/0104392 A1* | 5/2012 | Son | G02F 1/134363 257/59 |
| 2013/0112983 A1* | 5/2013 | Kao | H01L 27/1255 257/71 |
| 2014/0092353 A1* | 4/2014 | Matsushima | G02F 1/133512 349/110 |
| 2015/0076486 A1 | 3/2015 | Hu et al. | |
| 2015/0187817 A1* | 7/2015 | Kim | G02F 1/136227 257/72 |
| 2015/0200206 A1* | 7/2015 | Liu | G02F 1/136286 257/72 |
| 2015/0234245 A1* | 8/2015 | Ito | G02F 1/134363 349/143 |
| 2015/0372013 A1 | 12/2015 | Wang | |
| 2016/0062203 A1* | 3/2016 | Ono | G02F 1/134363 349/43 |
| 2016/0070143 A1* | 3/2016 | Jiang | G02F 1/134309 349/138 |
| 2016/0190178 A1* | 6/2016 | Ding | H01L 27/1244 257/659 |
| 2016/0240557 A1* | 8/2016 | Xu | G02F 1/134363 |
| 2016/0320650 A1* | 11/2016 | Ding | G02F 1/13338 |
| 2016/0370676 A1* | 12/2016 | Ono | G02F 1/13338 |

FOREIGN PATENT DOCUMENTS

| | | | |
|---|---|---|---|
| CN | 104280951 A | | 1/2015 |
| CN | 104335113 A | | 2/2015 |
| CN | 104460143 A | | 3/2015 |
| CN | 105116642 A | | 12/2015 |
| CN | 204905257 U | | 12/2015 |
| WO | WO 2016045423 | * | 9/2014 |
| WO | 2014181494 A1 | | 11/2014 |

OTHER PUBLICATIONS

Oct. 16, 2017—(CN) First Office Action Appn 201510618081.6 with English Tran.
Apr. 10, 2019—(EP) Extended European Search Report Appn 16847734.7.

* cited by examiner

ARRAY SUBSTRATE, MANUFACTURING METHOD THEREOF, AND DISPLAY DEVICE

The application is a U.S. National Phase Entry of International Application No. PCT/CN2016/073627 filed on Feb. 5, 2016, designating the United States of America and claiming priority to Chinese Patent Application No. 201510618081.6, filed on Sep. 24, 2015. The present application claims priority to and the benefit of the above-identified applications and the above-identified applications are incorporated by reference herein in their entirety.

FIELD OF THE ART

At least one embodiment of the invention relates to an array substrate, a method for fabricating the same and a display device.

BACKGROUND

Advanced Super Dimensional Switching (ADS) technology is widely used in various display devices due to its advantages such as high resolution, high transmittance, low power consumption, wide viewing angle, high aperture ratio and low color aberration, etc. In an ADS liquid crystal display device, both pixel electrode and common electrode are disposed on an array substrate. For example, the pixel electrode has a plate-like structure, the common electrode has a slit structure, and the pixel electrode is disposed between the common electrode and a base substrate of the array substrate. By applying voltages to the common electrode and the pixel electrode respectively, an electric field is formed between the common electrode and the pixel electrode, thereby controlling the deflection of liquid crystal molecules, which in turn controls light passing through the LCD panel.

A plurality of gate lines and a plurality of data lines are disposed on the array substrate. As an example, the gate lines and the data lines intersect with each other to define a plurality of sub-pixel units. As an example, it can realize image display by applying gate scanning signals to the gate lines sequentially. In order to achieve a better display effect, the voltage applied to the pixel electrode usually remains above a certain voltage value until the gate scanning signal of the next frame arrives. If the voltage at the pixel electrode drops too early, the display effect of the ADS LCD device will be compromised. In this case, each of the sub-pixel units on the array substrate of the ADS LCD display device usually includes a storage capacitor to meet the requirement of maintaining the stability of the voltage applied to the pixel electrode.

SUMMARY

At least one embodiment of the invention provides an array substrate, a method for fabricating the same and a display device, so as to maintain a large aperture ratio of the sub-pixel units while increasing storage capacitance of the array substrate.

At least one embodiment of the invention provides an array substrate, which comprises a sub-pixel unit, wherein the sub-pixel unit comprises: a first transparent common electrode; a pixel electrode disposed above and insulated from the first transparent common electrode, wherein an orthographic projection of the first transparent common electrode on a plane having the pixel electrode partially overlaps the pixel electrode; and a second transparent common electrode disposed above and insulated from the pixel electrode.

At least one embodiment of the invention further provides a display device comprising the afore-mentioned array substrate.

At least one embodiment of the invention further provides a method for fabricating an array substrate, comprising: forming a sub-pixel unit, wherein forming the sub-pixel unit further comprises: forming a first transparent common electrode; forming a pixel electrode on the first transparent common electrode, wherein the pixel electrode is insulated from the first transparent common electrode and an orthographic projection of the first transparent common electrode on a plane having the pixel electrode partially overlaps the pixel electrode; and forming a second transparent common electrode on the pixel electrode, wherein the second transparent common electrode is insulated from the pixel electrode.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1b schematically illustrates cross section views taken along lines AA, BB and CC in FIG. 1a;

FIG. 3b schematically illustrates a cross section view taken along line EE in FIG. 3a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Similar, the term "a," "an," "the," etc., are not intended to indicate only one, but represents at least one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
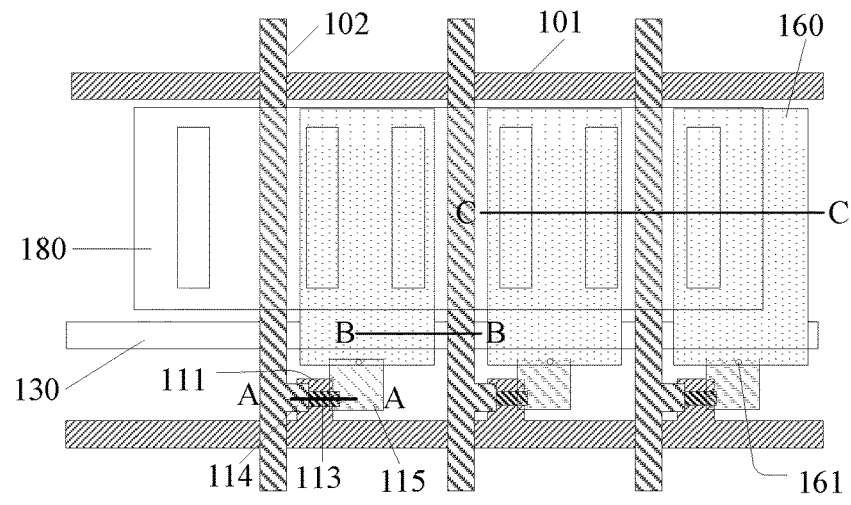
FIG. 1a schematically illustrates a top view of an ADS array substrate.
Figure 1B:
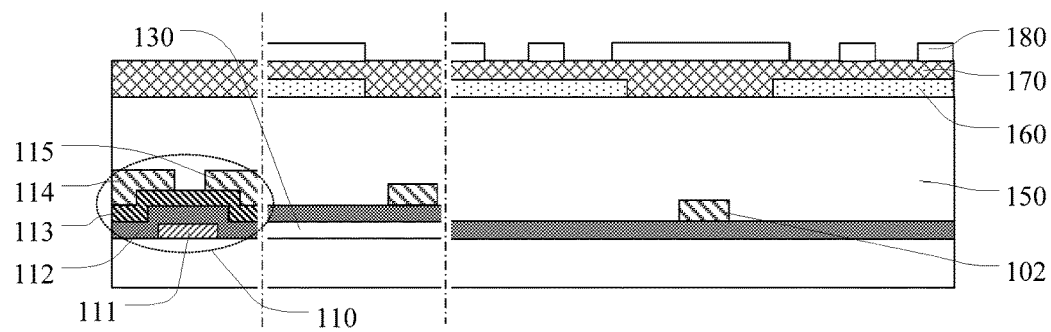

FIG. 1a schematically illustrates a top view of an ADS array substrate. FIG. 1b schematically illustrates cross section views taken along the line AA, the line BB and the line CC in FIG. 1a. As illustrated in FIGS. 1a and 1b, the ADS array substrate comprises a plurality of gate lines 101 and a plurality of data lines 102, and the gate lines 101 and the data lines 102 intersect with each other to define a plurality of sub-pixel units. As an example, each of the sub-pixel units comprises a TFT 110, a pixel electrode 160 and a common electrode 180. The pixel electrode 160 and the common electrode 180 are disposed on a planarization layer 150 and insulated from each other through an insulation layer 170. The TFT 110 comprises a gate electrode 111, a gate insulation layer 112, an active layer 113, a source electrode 114 and a drain electrode 115. The gate electrode 111 may be integrally formed with or electrically connected to the gate line 101, the source electrode 114 may be integrally formed with or electrically connected to the data line 102, the drain electrode 115 is for example electrically connected to the pixel electrode 160 through a via hole 161. For example, the ADS array substrate further comprises a common electrode line 130 electrically connected to the common electrode 180, and the common electrode line 130 is for example disposed in a same layer as the gate line 101.

The inventor of the invention found through research that storage capacitance in the ADS array substrate is typically generated by an overlapping portion between the common electrode 180 and the pixel electrode 160. However, the storage capacitance is often affected by the thickness of the insulation layer 170 or resolution or other factors, and thus difficult to be increased.

Figure 2A:
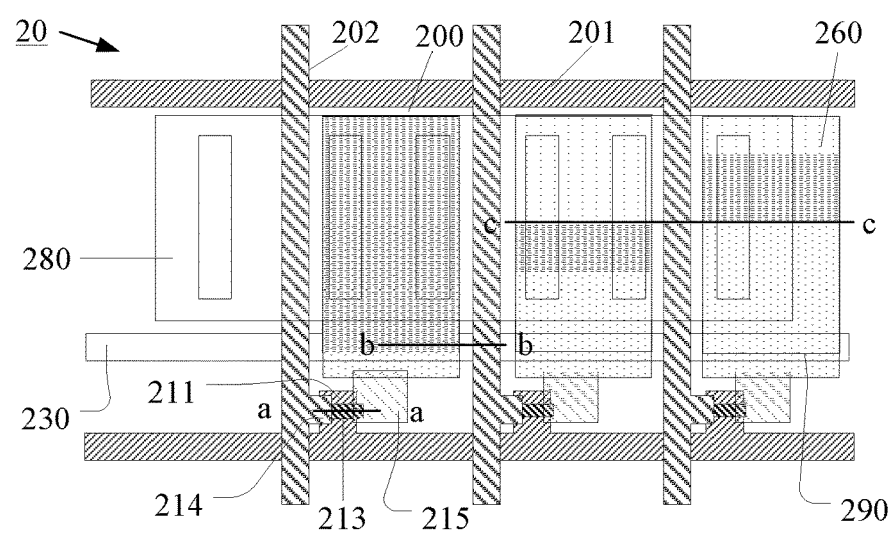
FIG. 2a schematically illustrates a top view of an array substrate in accordance with an embodiment of the invention.
Figure 2B:
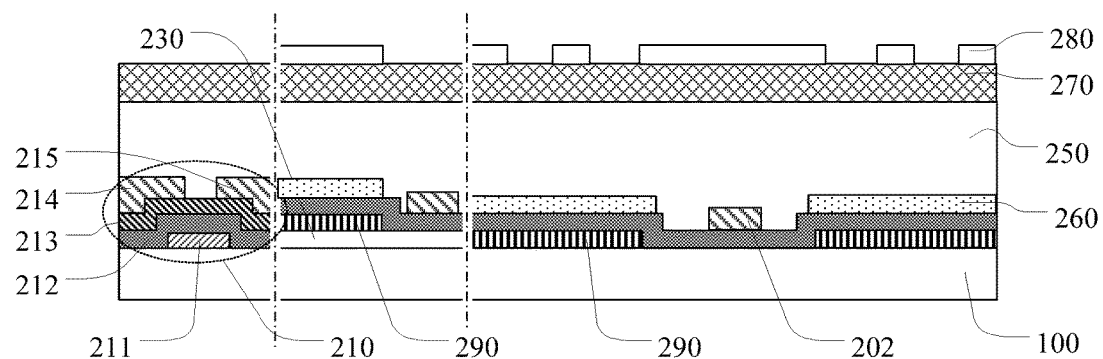
FIG. 2b schematically illustrates cross section views taken along lines aa, bb and cc in FIG. 2a of an array substrate in accordance with an embodiment of the invention.

As illustrated in FIGS. 2a and 2b, at least one embodiment of the invention provides an array substrate 20 comprising a sub-pixel unit 200, the sub-pixel unit 200 comprises a first transparent common electrode 290, a pixel electrode 260 and a second transparent common electrode 280, the pixel electrode 260 is disposed above the first transparent common electrode 290 (i.e., disposed on a side of the first transparent common electrode 290 far away from a base substrate 100) and insulated from the first transparent common electrode 290 (i.e., an insulation layer is disposed between them), an orthographic projection of the first transparent common electrode 290 on a plane having the pixel electrode 260 partially overlaps the pixel electrode 260, and the second transparent common electrode is disposed above the pixel electrode 260 (i.e., disposed on a side of the pixel electrode 260 far away from the first transparent common electrode 290) and insulated from the pixel electrode 260 (i.e., an insulation layer is disposed between them).

In the array substrate provided by the embodiment of the invention, by providing the first transparent common electrode 290 overlapping the pixel electrode 260, a capacitance is generated between the first transparent common electrode 290 and the pixel electrode 260, thereby obtaining a larger storage capacitance. The first transparent common electrode 290 is configured as light-transmittable, thereby guaranteeing an aperture ratio of the array substrate. Moreover, the first transparent common electrode 290 is disposed on the side of the pixel electrode 260 far away from the second transparent common electrode 280, so as to avoid influencing the electric field which is generated between the pixel electrode 260 and the second transparent common electrode 280 and used to control the liquid crystals.

As an example, the orthographic projection of the first transparent common electrode 290 (i.e., the orthographic projection on the plane having the pixel electrode 260) is in a region having the pixel electrode 260. In this case, it can further avoid influencing, by the first transparent common electrode 290, the electric field which is generated between the pixel electrode 260 and the second transparent common electrode 280 and used to control the liquid crystals.

As an example, a material for fabricating the first transparent common electrode 290 comprise transparent electrically conductive metal oxides such as indium tin oxide, indium gallium zinc oxide, indium zinc oxide, and the like.

A material for fabricating the pixel electrode 260 and the second transparent common electrode 280 also comprises transparent electrically conductive metal oxides such as indium tin oxide, indium gallium zinc oxide, indium zinc oxide, and the like.

The orthographic projection of the second transparent common electrode 280 on the plane having the pixel electrode 260 may partially overlap the pixel electrode 260 or may be outside the region having the pixel electrode 260.

As an example, the array substrate 20 further comprises a planarization layer 250 disposed between the pixel electrode 260 and the second transparent common electrode 280 along a direction perpendicular to the base substrate 100. The planarization layer 250 provides a flat surface for flattening, and the planarization layer 250 is usually made of an organic material such as resin and the like, such that it may be made relatively thick, thereby lowering the parasitic capacitance between electrically conductive layers on both sides of the planarization layer (for example, the source/drain metal layer having data lines 202 and the layer having the second transparent common electrode 280 in FIG. 2b).

In FIGS. 1a and 1b, both the pixel electrode 160 and the common electrode 180 are disposed on the planarization layer 150, and the pixel electrode 160 is electrically connected to the drain electrode 115 of the TFT 110 through a via hole 161 penetrating the planarization layer 150. As the planarization layer 150 is relatively thick, if the via hole 161 is made too large, the aperture ratio of the sub-pixel unit will be reduced. If the via hole 161 is made too small, the pixel electrode 160 will easily break at the via hole 161, causing a broken circuit between the pixel electrode 160 and the drain electrode 115.

In comparison with FIGS. 1a and 1b, in the array substrate 20 provided by the embodiment of the invention, the planarization layer 250 is disposed between the pixel electrode 260 and the second transparent common electrode 280, thus allowing the pixel electrode 260 to be electrically connected to the drain electrode 215 of the TFT 210 with no need of passing through the via hole penetrating the planarization layer 250, thereby increasing the aperture ratio of the sub-pixel unit and preventing broken circuit between the pixel electrode 260 and the drain electrode 215 of the TFT 210.

The embodiment of the invention is not limited to any specific structure of the TFT 210. As an example, in the TFT 210 as illustrated in FIGS. 2a and 2b, a gate electrode 211 is disposed under an active layer 213 (i.e., disposed between the active layer 213 and the base substrate 100), and a source electrode 214 and a drain electrode 215 are disposed above the active layer 213 (i.e., disposed on a side of the active layer 213 far away from the base substrate 100). It can be contemplated that the TFT 210 may also employ other structures commonly used in the art. As an example, the gate electrode, the source electrode and the drain electrode are all disposed above the active layer, or the gate electrode, the source electrode and the drain electrode are all disposed under the active layer, or the gate electrode is disposed above the active layer and the source/drain electrode is disposed under the active layer.

In the embodiment of the invention, the planarization layer 250 is disposed between the pixel electrode 260 and the second transparent common electrode 280. In this case, the pixel electrode 260 and the drain electrode 215 of the TFT 210 are in direct contact with each other, or they are electrically connected with each other through a via hole in the insulation layer disposed therebetween, or they are electrically connected through other electrically conductive components. It will not be elaborated herein.

Still referring to FIGS. 2a and 2b, the array substrate 20 further comprises a plurality of gate lines 201 and a plurality of data lines 202, and the gate lines 201 and the data lines 202 intersect with each other to form the sub-pixel units 200. As an example, an orthographic projection of at least one of the gate line 201 and the data line 202 on a plane having the first transparent common electrode 290 is outside a region having the first transparent common electrode 290. By this means, it can prevent the parasitic capacitance caused by the overlapping of the first transparent common electrode 290 and the gate lines 201/data lines 202. FIGS. 2a and 2b illustrate an example where the orthographic projections of both the gate lines 201 and the data lines 202 on the plane having the first transparent common electrode 290 are outside the region having the first transparent common electrode 290. The embodiment of the invention includes but is not limitative to the situation illustrated in the figures.

As an example, in an embodiment of the invention, the array substrate 20 further comprises a common electrode line 230, and the first transparent common electrode 290 is electrically connected to the common electrode line 230. The embodiment of the invention includes but is not limitative to this configuration, as long as a voltage difference is present between the first transparent common electrode 290 and the pixel electrode 260 so as to generate a capacitance between them.

As an example, the first transparent common electrode 290 is in direct contact with the common electrode line 230 (i.e., they are not electrically connected through a via hole in the insulation layer or other electrically conductive components), and a contact region between the first transparent common electrode 290 and the common electrode line 230 is substantially identical with a region of an orthographic projection of the first transparent common electrode 290 on a plane having the common electrode line 230. As the first transparent common electrode 290 is in direct contact with the common electrode line 230, it is not necessary to introduce the insulation layer therebetween. In this case, the array substrate provided by the embodiment of the invention is simpler in structures and fabrication process.

As an example, the common electrode line 230 is disposed in a same layer as the gate lines 201 or the data lines 202.

As an example, in the case that the first transparent common electrode 290 is in direct contact with the common electrode line 230 and the common electrode line 230 is disposed in a same layer as the gate lines 201, the array substrate 20 further comprises a electrically conductive structure covering an end of the gate lines 201, and the electrically conductive structure is disposed in a same layer as the first transparent common electrode 290 (i.e., formed from a same thin film). In the embodiment of the invention, the electrically conductive structure covers and is in direct contact with the end of the gate lines 201 so as to protect the end of the gate lines 201 effectively. Moreover, there is no insulation layer between the layer having the electrically conductive structure and the gate lines along a direction orthogonal to the plane having the array substrate, thus allowing the fabricating process of the embodiment of the invention to be simple.

The end of the gate lines 201 is the part of the gate lines outside a pixel region of the array substrate 20 (i.e., the pixel regions is a region formed by the outermost sub-pixel units on the array substrate), that is, the part of the gate lines located at a wiring area outside the display area. As an example, a gate electrode driver is further disposed on the array substrate (for example, a gate electrode driving IC), and the end of the gate lines 201 is electrically connected to the gate electrode driver.

Similarly, as an example, in the case that the first transparent common electrode 290 is in direct contact with the common electrode line 230 and disposed in a same layer as the data lines 202, the array substrate 20 further comprises an electrically conductive structure covering end of the data lines 202, and the electrically conductive structure is disposed in a same layer as the first transparent common electrode 290.

As an example, a source electrode driver is further disposed on the array substrate (for example, a source electrode driving IC), and the end of the data lines 202 is electrically connected to the source electrode driver.

Figure 3A:
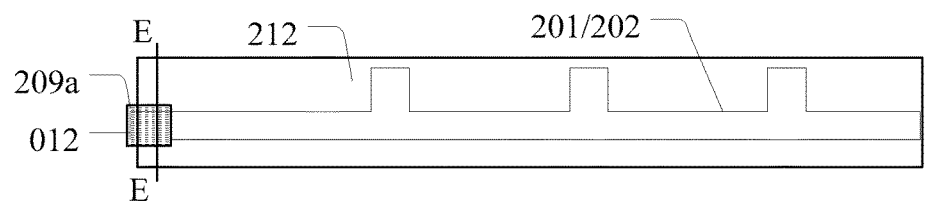
FIG. 3a schematically illustrates a top view with an end of a gate line having a electrically conductive structure disposed thereon in an array substrate in accordance with an embodiment of the invention.
Figure 3B:
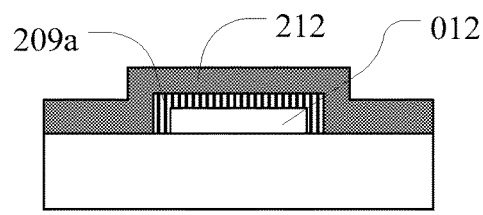

As an example illustrated in FIGS. 3a and 3b, an electrically conductive structure 209a is disposed on the end of the gate line 201 or data line 202. As an example, a gate insulation layer 212 of the TFT 210 is further disposed on the electrically conductive structure 209a.

The embodiment is described with reference to an example of the first transparent common electrode 290 being in direct contact with the common electrode line 230. It can be contemplated that the embodiment of the invention includes but is not limitative to the example. As an example, along the direction perpendicular to the plane having the array substrate, an insulation layer is disposed between the first transparent common electrode 290 and the common electrode line 230, and the first transparent common electrode 290 is electrically connected to the common electrode line 230 through a via hole in the insulation layer.

In the embodiment of the invention, the second transparent common electrode 280 and the first transparent common electrode 290 are electrically connected to the same common electrode line 230, or electrically connected to different common electrode lines. In the case that the array substrate 20 comprises the planarization layer 250, the second transparent common electrode 280 is electrically connected to a common electrode line through a via hole penetrating the planarization layer 250, and the via hole is disposed outside the pixel region of the array substrate 20 so as to prevent influencing the aperture ratio of the sub-pixel units mostly.

Figure 4:
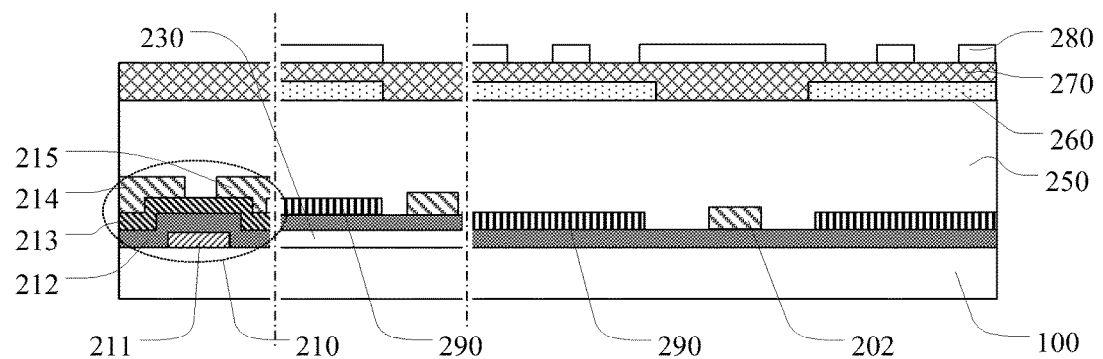
FIG. 4 schematically illustrates cross section views taken along lines aa, bb and cc in FIG. 2a of another array substrate in accordance with an embodiment of the invention.

In order to simplify the fabricating process, as an example illustrated in FIG. 4, the active layer 213 of the TFT 210 is disposed in a same layer as the first transparent common electrode 290. That is, the active layer 213 of the TFT 210 and the first transparent common electrode 290 may be formed from a single thin film.

As an example, in the case that the active layer 213 of the TFT 210 is in a same layer as the first transparent common electrode 290, the material of the active layer 213 comprises a transparent electrically conductive metal oxide (such as indium gallium zinc oxide and the like) or a doped low temperature polysilicon, as long as the active layer 213 is made of a transparent material and having a good semiconductive performance.

As an example, in the case that the material of the active layer comprises a doped low temperature polysilicon, for the convenience of fabricating the active layer 213, the gate electrode 211, the source electrode 214 and the drain electrode 215 are all disposed on a side of the active layer 213 away from the base substrate 100. In this case, the source electrode 214 and the drain electrode 215 are disposed between the layer having the gate electrode 211 and the layer having the active layer 213, or are disposed on the side of the gate electrode 211 away from the active layer 213. It may be understood that the embodiment of the invention includes but is not limitative to the example.

As an example, in order to simplify the fabricating process, the first transparent common electrode is disposed in a same layer as and insulated from the gate lines. In this case, the gate lines are made of a transparent electrically conductive material. Alternatively, the first transparent common electrode is disposed in a same layer as and insulated from the data lines. In this case, the data lines are made of a transparent electrically conductive material.

Figure 5A:
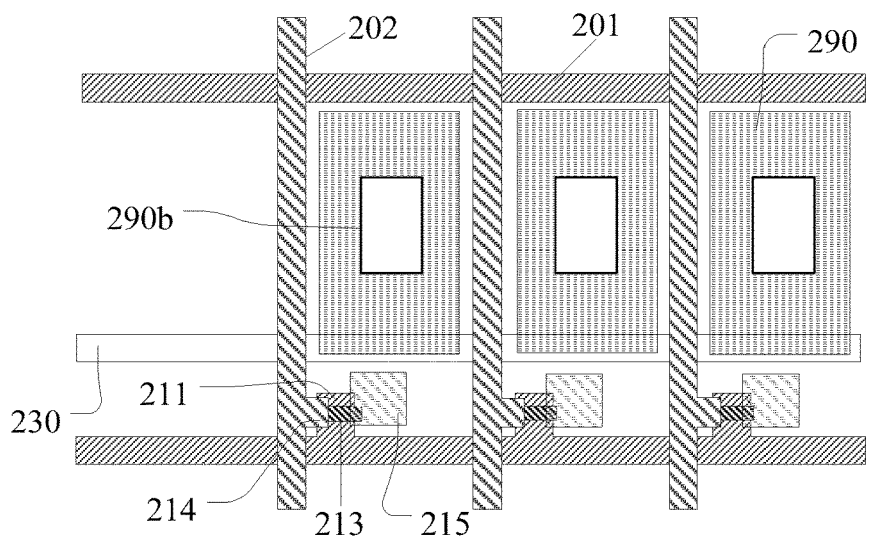
FIG. 5a and FIG. 5b schematically illustrates top views of a first transparent common electrode having a hollow portion formed therein in an array substrate in accordance with an embodiment of the invention.
Figure 5B:
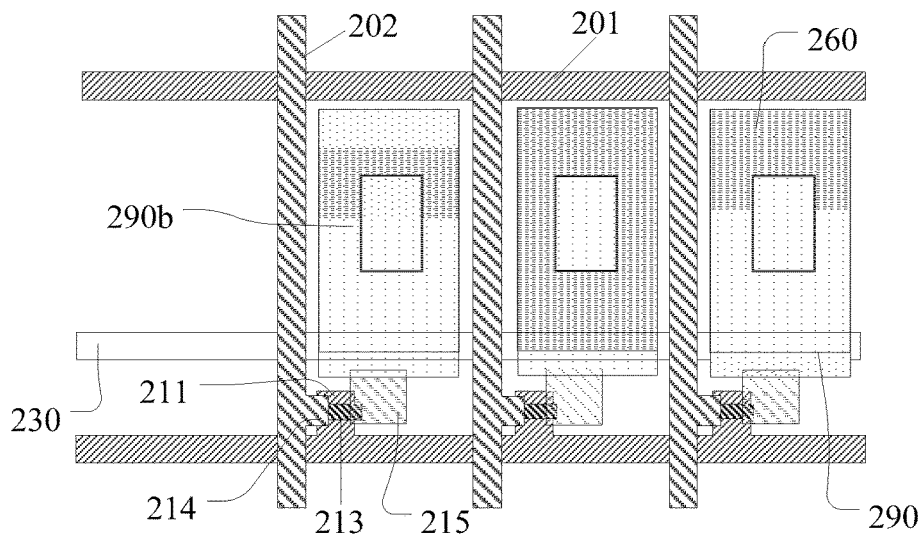

As an example illustrated in FIGS. 5a and 5b, the first transparent common electrode 290 has a hollow portion 290b, and an orthographic projection of the hollow portion 290b on the plane having the pixel electrode 260 is in the region of the pixel electrode 260. In the embodiment of the invention, the area of the overlapping portion between the first transparent common electrode 290 and the pixel electrode 260 is changed by disposing the hollow portion 290b, and in turns the capacitance therebetween is adjusted. That is, the amount of the increased storage capacitance of the array substrate 20 can be adjusted by changing the size and number of the hollow portion 290b.

A planar shape of the hollow portion 290b may be any pattern. As an example, the planar shape of the hollow portion 290b along a direction of the plane having the first transparent common electrode 290 is a polygon, a circle or an ellipse.

At least one embodiment of the invention provides a display device comprising the array substrate 20 provided by any of the embodiments.

Figure 6:
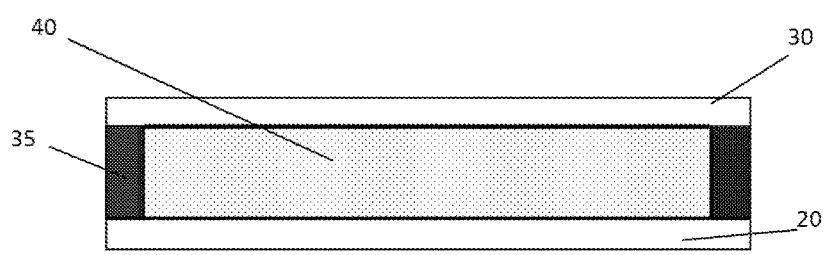
FIG. 6 schematically illustrates a cross section view of a display device in accordance with an embodiment of the invention.

As an example illustrated in FIG. 6, the display device of the embodiment comprises the array substrate 20 and an opposed substrate 30, the array substrate 20 and the opposed substrate 30 are disposed opposed to each other to form a liquid crystal cell through a sealant 35, and a liquid crystal material 40 is filled in the liquid crystal cell. The opposed substrate 30 is for example a color filter substrate. The pixel electrode and second transparent common electrode of each of the sub-pixel units of the array substrate 20 (with reference the relevant description of the embodiment of the array substrate) are configured for applying an electric field to control the degree of rotation of the liquid crystal material for display operation.

The display device is for example a liquid crystal panel, an e-paper, a mobile phone, a tablet PC, a television, a monitor, a laptop computer, a digital photo-frame, a navigator or any products or components with a display function.

Figure 7:
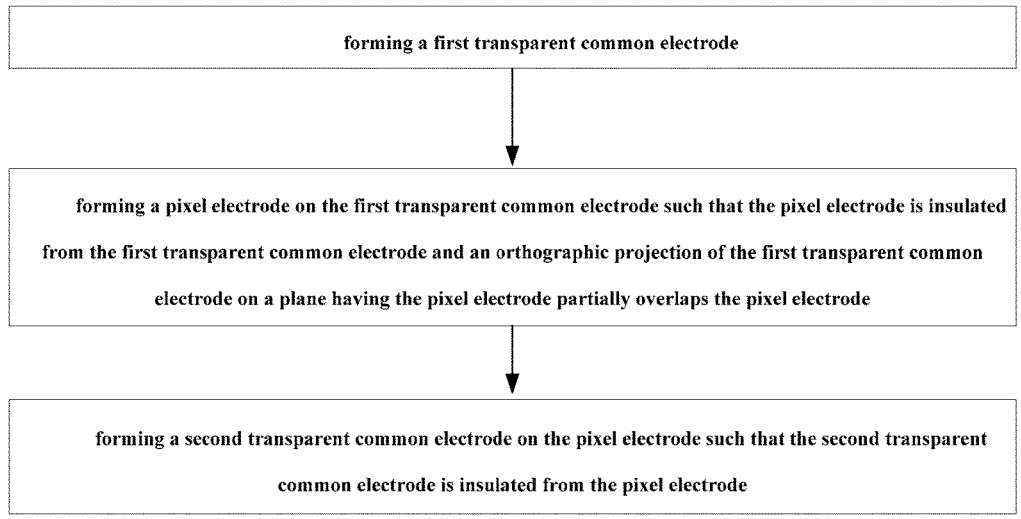
FIG. 7 schematically illustrates a flow chart of a method for fabricating an array substrate in accordance with an embodiment of the invention.

At least one embodiment of the invention further provides a method for fabricating an array substrate. The method comprises: forming a sub-pixel unit. As illustrated in FIG. 7, the step of forming the sub-pixel unit further comprises: forming a first transparent common electrode; forming a pixel electrode on the first transparent common electrode such that the pixel electrode is insulated from the first transparent common electrode and an orthographic projection of the first transparent common electrode on a plane having the pixel electrode partially overlaps the pixel electrode; and forming a second transparent common electrode on the pixel electrode such that the second transparent common electrode is insulated from the pixel electrode. On the array substrate provided by the embodiment of the invention, through disposing the first transparent common electrode overlapping the pixel electrode, it can obtain a larger storage capacitance on the premise of ensuring the aperture ratio of the sub-pixel units, and prevent the compromise to the electric field between the pixel electrode and the second transparent common electrode as much as possible.

As an example, the method provided by the embodiment of the invention further comprises: after the pixel electrode is formed and before the second transparent common electrode is formed, forming a planarization layer on the pixel electrode. In this case, it can increase the aperture ratio of the obtained sub-pixel units and prevent the short circuit from occurring between the pixel electrode and the second transparent common electrode.

Figure 8A:
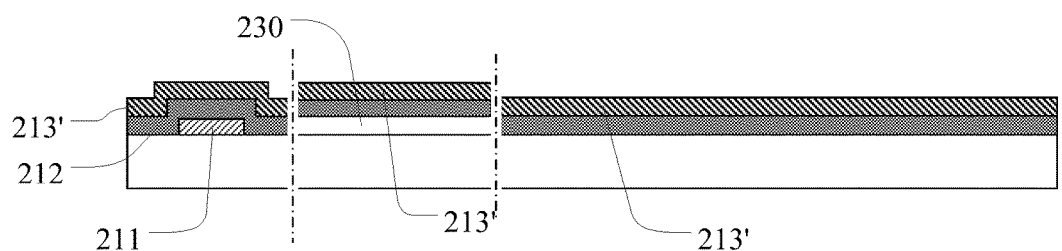
FIG. 8a and FIG. 8b schematically illustrate steps of fabricating the first transparent common electrodes by using a material of an active layer in accordance with an embodiment of the invention.
Figure 8B:
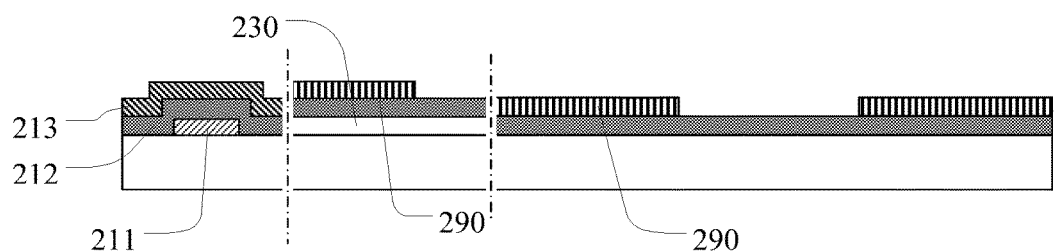

As an example, the sub-pixel unit comprises a TFT and the TFT comprises an active layer. In this case, the step of forming the first transparent common electrode may comprise: forming a transparent electrically conductive film 213' as illustrated in FIG. 8a; performing a patterning process on the transparent electrically conductive film 213' as illustrated in FIG. 8b so as to form an active layer 213 and a first transparent common electrode 290. In this way, the individual process of forming the first transparent common electrode can be omitted.

In the disclosure, the patterning process may be a method of forming a predetermined pattern by using a mask plate, for example, the method includes steps of applying a photoresist, exposing the photoresist, developing the photoresist, etching a thin film layer using a photoresist pattern, etc. However, the embodiment of the invention is not limitative to the example, and the patterning process may be other processing methods to form the predetermined pattern.

Taking the situation as illustrated in FIGS. 2a and 2b as an example, the method for fabricating the array substrate provided by the embodiment of the invention for example comprises the following steps from step 1 to step 8.

Step 1: forming a gate metal layer which comprises the gate electrode 211, the plurality of gate lines 201 and the common electrode line 230 by using a patterning process (for example, comprises the steps of exposing, developing, etching and the like).

Figure 9A:
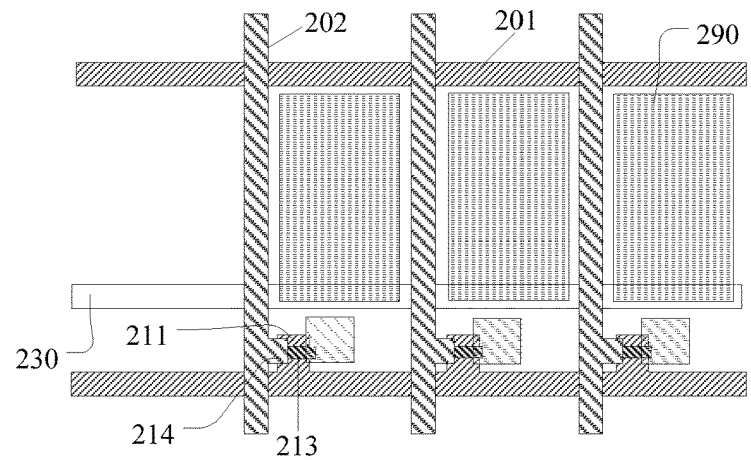
FIG. 9a schematically illustrates a top view of an array substrate after the first transparent common electrode is formed during a method for fabricating an array substrate in accordance with an embodiment of the invention.

Step 2: forming a transparent electrically conductive film on the gate metal layer and performing a patterning process on the transparent electrically conductive film to form the first transparent common electrode 290, wherein the first transparent common electrode 290 is in direct contact with the common electrode line 230 as illustrated in FIG. 9a.

As an example, during the step, a portion of the transparent electrically conductive film is remained at the ends of the gate lines (i.e., the afore-mentioned electrically conductive structure) so as to protect the ends of the gate lines.

Step 3: forming the gate insulation layer 212 on the first transparent common electrode 290.

Step 4: forming the active layer 213 on the gate insulation layer 212.

Step 5: form a source/drain metal layer which comprises the source electrode 214, the drain electrode 215 and the data lines 202 by using a patterning process. The source electrode 214 and the drain electrode 215 are electrically connected to the active layer 213 respectively to form the TFT 210.

Figure 9B:
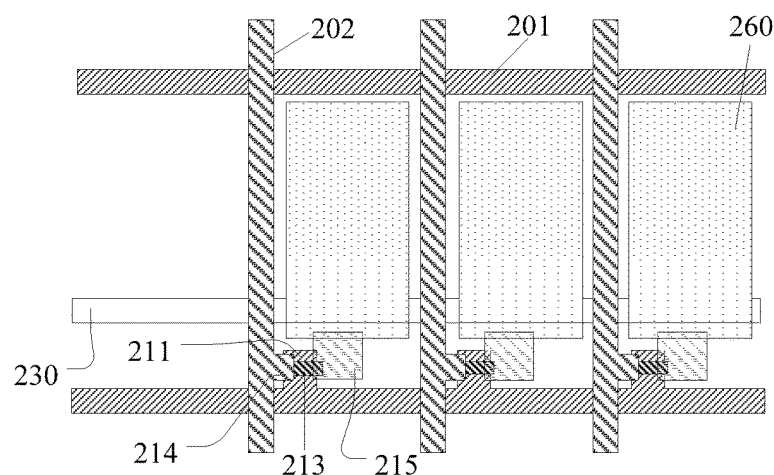
FIG. 9b schematically illustrates a top view of an array substrate after the pixel electrode is formed during a method for fabricating an array substrate in accordance with an embodiment of the invention.

Step 6: forming the pixel electrode 260 and allowing the pixel electrode 260 to be electrically connected to the drain electrode 215 of the TFT 210 as illustrated in FIG. 9b.

Step 7: forming the planarization layer 250 on the pixel electrode 260 and the via hole in the planarization layer 250. The via hole exposes a part of a surface of the first transparent common electrode 290, or exposes a part of a surface of the common electrode line 230.

Figure 9C:
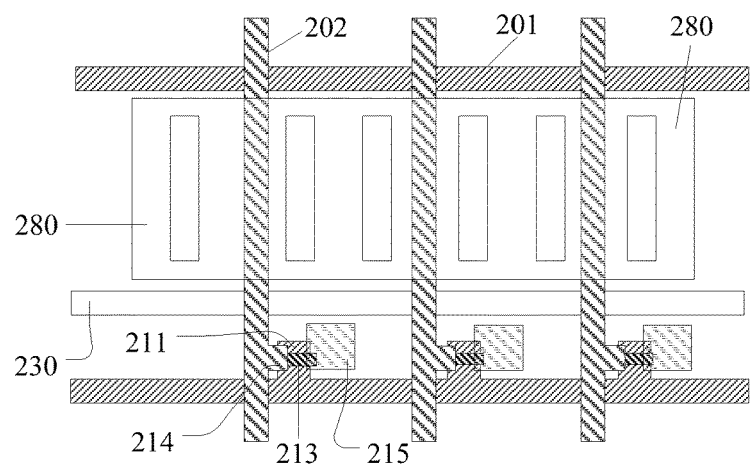
FIG. 9c schematically illustrates a top view of an array substrate after the second transparent common electrode is formed during a method for fabricating an array substrate in accordance with an embodiment of the invention.

Step 8: forming the second transparent common electrode 290 on the planarization layer 250 as illustrated in FIG. 9c. The second transparent common electrode 290 is electrically connected to the first transparent common electrode 290 or the common electrode line 230 through the via hole of step 7.

In the method provided by the embodiment of the invention, the configuration of various structures can refer to the embodiment of the array substrate, and the repetition will not be elaborated herein.

What is described above is related to the illustrative embodiments of the disclosure only and not limitative to the scope of the disclosure; the scopes of the disclosure are defined by the accompanying claims.

The present application claims priority from Chinese Application No. 201510618081.6, filed on Sep. 24, 2015, the disclosure of which is incorporated herein by reference in its entirety.

What is claimed is:

1. An array substrate, the array substrate having a pixel region and comprising:
   gate lines, at least one of the gate lines having an end outside the pixel region;
   data lines, at least one of the data lines having an end outside the pixel region;
   an electrically conductive structure, being outside the pixel region and overlying at least one of the end of the at least one of the gate lines and the end of the at least one of the data lines; and
   a sub-pixel unit, being in the pixel region and comprising:
      a first transparent common electrode;
      a pixel electrode disposed above and insulated from the first transparent common electrode, wherein an orthographic projection of the first transparent common electrode on a plane having the pixel electrode partially overlaps the pixel electrode; and
      a second transparent common electrode disposed above and insulated from the pixel electrode,
   wherein the electrically conductive structure is in same layer as the first transparent common electrode.

2. The array substrate of claim 1, further comprising a planarization layer disposed between the pixel electrode and the second transparent common electrode.

3. The array substrate of claim 2, wherein the orthographic projection of the first transparent common electrode is located within a region of the pixel electrode.

4. The array substrate of claim 2, wherein the first transparent common electrode has a hollow portion, and an orthographic projection of the hollow portion on the plane having the pixel electrode is located in a region of the pixel electrode.

5. The array substrate of claim 1, wherein the orthographic projection of the first transparent common electrode is located within a region of the pixel electrode.

6. The array substrate of claim 5, wherein the first transparent common electrode has a hollow portion, and an orthographic projection of the hollow portion on the plane having the pixel electrode is located in the region of the pixel electrode.

7. The array substrate of claim 1, wherein the gate lines and the data lines intersect with each other to form the sub-pixel unit, and an orthographic projection of at least one of a gate line and a data line on a plane having the first transparent common electrode is located outside a region of the first transparent common electrode.

8. The array substrate of claim 7, further comprising a common electrode line, wherein the first transparent common electrode is in direct contact with the common electrode line, and a contact region between the first transparent common electrode and the common electrode line overlaps with a region of an orthographic projection of the first transparent common electrode on a plane having the common electrode line.

9. The array substrate of claim 8, wherein
   the common electrode line is disposed in a same layer as the gate lines, the electrically conductive structure overlies the end of the at least one of the gate lines; or
   the common electrode line is disposed in a same layer as the data lines, the electrically conductive structure overlies the end of the at least one of the data lines.

10. The array substrate of claim 9, wherein the first transparent common electrode has a hollow portion, and an orthographic projection of the hollow portion on the plane having the pixel electrode is located in a region of the pixel electrode.

11. The array substrate of claim 8, wherein the first transparent common electrode has a hollow portion, and an orthographic projection of the hollow portion on the plane having the pixel electrode is located in a region of the pixel electrode.

12. The array substrate of claim 7, wherein the first transparent common electrode has a hollow portion, and an orthographic projection of the hollow portion on the plane having the pixel electrode is located in a region of the pixel electrode.

13. The array substrate of claim 1, wherein the first transparent common electrode has a hollow portion, and an orthographic projection of the hollow portion on the plane having the pixel electrode is located in a region of the pixel electrode.

14. The array substrate of any of claim 13, wherein a shape of the hollow portion in the plane having the first transparent common electrode is a polygon, a circle or an ellipse.

15. The array substrate of claim 1, further comprising a common electrode line, wherein the first transparent common electrode is in contact with the common electrode line, and a contact region between the first transparent common electrode and the common electrode line overlaps with a region of an orthographic projection of the first transparent common electrode on a plane having the common electrode line.

16. The array substrate of claim 1, wherein the sub-pixel unit further comprises a thin film transistor (TFT), wherein the TFT comprises an active layer, and wherein the active layer is disposed in a same layer as the first transparent common electrode.

17. A display device comprising an array substrate, the array substrate having a pixel region and comprising:
    gate lines, at least one of the gate lines having an end outside the pixel region;
    data lines, at least one of the data lines having an end outside the pixel region;
    an electrically conductive structure, being outside the pixel region and overlying at least one of the end of the at least one of the gate lines and the end of the at least one of the data lines; and
    a sub-pixel unit, being in the pixel region and comprising:
        a first transparent common electrode;
        a pixel electrode disposed above and insulated from the first transparent common electrode, wherein an orthographic projection of the first transparent common electrode on a plane having the pixel electrode partially overlaps the pixel electrode; and
        a second transparent common electrode disposed above and insulated from the pixel electrode,
    wherein the electrically conductive structure is in same layer as the first transparent common electrode.

18. A method for fabricating an array substrate, the array substrate having a pixel region, the method comprising:
    forming gate lines, at least one of the gate lines having an end outside the pixel region;
    forming data lines, at least one of the data lines having an end outside the pixel region;
    forming an electrically conductive structure, the electrically conductive structure being outside the pixel region and overlying at least one of the end of the at least one of the gate lines and the end of the at least one of the data lines;
    forming a sub-pixel unit in the pixel region, wherein the forming the sub-pixel unit comprises:
        forming a first transparent common electrode;
        forming a pixel electrode on the first transparent common electrode, wherein the pixel electrode is insulated from the first transparent common electrode, and wherein an orthographic projection of the first transparent common electrode on a plane having the pixel electrode partially overlaps the pixel electrode; and
        forming a second transparent common electrode on the pixel electrode, wherein the second transparent common electrode is insulated from the pixel electrode,
    wherein the electrically conductive structure is in a same layer as first transparent common electrode.

19. The method of claim 18, further comprising:
    forming a planarization layer on the pixel electrode, after forming the pixel electrode and before forming the second transparent common electrode.

20. The method of claim 18, wherein the sub-pixel unit further comprises a TFT, wherein the TFT comprises an active layer, and wherein the forming the first transparent common electrode comprises:
    forming a transparent electrically conductive film; and
    patterning the transparent electrically conductive film so as to form the active layer and the first transparent common electrode.

* * * * *